(12) United States Patent
Furukawa et al.

(10) Patent No.: US 8,698,392 B2
(45) Date of Patent: Apr. 15, 2014

(54) ORGANIC ELECTROLUMINESCENT ELEMENT

(75) Inventors: Yukio Furukawa, Tokyo (JP); Teppei Yamada, Tokyo (JP); Yoshinobu Ono, Ibaraki (JP)

(73) Assignees: Sumitomo Chemical Company, Limited, Tokyo (JP); Waseda University, Tokyo (JP)

( * ) Notice: Subject to any disclaimer, the term of this patent is extended or adjusted under 35 U.S.C. 154(b) by 0 days.

(21) Appl. No.: 12/278,409

(22) PCT Filed: Feb. 6, 2007

(86) PCT No.: PCT/JP2007/052007
§ 371 (c)(1),
(2), (4) Date: Aug. 6, 2008

(87) PCT Pub. No.: WO2007/091548
PCT Pub. Date: Aug. 16, 2007

(65) Prior Publication Data
US 2009/0174315 A1 Jul. 9, 2009

(30) Foreign Application Priority Data

Feb. 7, 2006 (JP) .................................. 2006-029690

(51) Int. Cl.
*H01L 51/50* (2006.01)
*H01L 51/52* (2006.01)
*H01L 51/54* (2006.01)

(52) U.S. Cl.
USPC .......................................... 313/506; 313/504

(58) Field of Classification Search
USPC ................... 313/498–512; 428/690–691, 917
See application file for complete search history.

(56) References Cited

U.S. PATENT DOCUMENTS

| 5,703,436 A | 12/1997 | Forrest et al. |
| 6,951,694 B2 | 10/2005 | Thompson et al. |

(Continued)

FOREIGN PATENT DOCUMENTS

| CN | 1665357 A | 9/2005 |
| CN | 1703128 A | 11/2005 |

(Continued)

OTHER PUBLICATIONS

H. Sugiura et al., "Double Heterostructure GaAs Tunnel Junction for a AlGaAs Tandem Solar Cell", Japanese Journal of Applied Physics, vol. 27, No. 2, (Feb. 1988), pp. 269-272.

(Continued)

*Primary Examiner* — Nimeshkumar Patel
*Assistant Examiner* — Jose M Diaz
(74) *Attorney, Agent, or Firm* — Sughrue Mion, PLLC (57) ABSTRACT

This invention provides an organic electroluminescent element comprising two opposed electrodes connected to an external circuit for applying electrical energy, at least one of the electrodes being transparent or semitransparent, and provided between the electrodes, a plurality of luminescent units, for emitting light through recombination of holes with electrons, each comprising one or more organic layers, one of the organic layers being a luminescent layer, and a charge generation layer held between two of the plurality of luminescent units, characterized in that each two adjacent luminescent units in the plurality of luminescent units are partitioned by the charge generation layer, the charge generation layer comprises at least one metal or its compound (A) having a work function of not more than 3.0 eV and at least one compound (B) having a work function of not less than 4.0 eV, and in at least one of the plurality of luminescent units, the luminescent layer contains a polymeric luminescent material.

15 Claims, 1 Drawing Sheet

(56) References Cited

U.S. PATENT DOCUMENTS

| | | | |
|---|---|---|---|
| 2003/0127967 A1 | 7/2003 | Tsutsui et al. | |
| 2003/0170491 A1 | 9/2003 | Liao et al. | |
| 2003/0189401 A1 | 10/2003 | Kido et al. | |
| 2004/0027059 A1* | 2/2004 | Tsutsui | 313/504 |
| 2004/0150333 A1* | 8/2004 | Tsutsui | 313/512 |
| 2005/0084713 A1 | 4/2005 | Kido et al. | |
| 2005/0098207 A1* | 5/2005 | Matsumoto et al. | 136/263 |
| 2005/0116241 A1* | 6/2005 | Yang et al. | 257/88 |
| 2005/0140275 A1* | 6/2005 | Park | 313/504 |
| 2005/0196526 A1 | 9/2005 | Ishida | |
| 2005/0260451 A1 | 11/2005 | Kijima | |
| 2006/0040132 A1* | 2/2006 | Liao et al. | 428/690 |
| 2006/0049419 A1* | 3/2006 | Tanaka et al. | 257/98 |
| 2006/0081840 A1* | 4/2006 | Mori et al. | 257/40 |
| 2006/0087225 A1* | 4/2006 | Liao et al. | 313/504 |
| 2006/0091794 A1* | 5/2006 | Agostinelli et al. | 313/506 |
| 2006/0158100 A1* | 7/2006 | Morii et al. | 313/503 |
| 2006/0186793 A1* | 8/2006 | Iou | 313/503 |
| 2006/0188745 A1* | 8/2006 | Liao et al. | 428/690 |
| 2007/0023874 A1* | 2/2007 | Kim et al. | 257/666 |
| 2007/0181887 A1* | 8/2007 | Kijima et al. | 257/79 |
| 2007/0210700 A1* | 9/2007 | Kato et al. | 313/504 |
| 2008/0003455 A1* | 1/2008 | Li et al. | 428/690 |
| 2008/0265751 A1* | 10/2008 | Smith et al. | 313/504 |
| 2008/0272689 A1* | 11/2008 | Ide et al. | 313/504 |
| 2009/0091240 A1* | 4/2009 | Ikeda et al. | 313/504 |
| 2009/0101928 A1* | 4/2009 | Kim et al. | 257/98 |
| 2010/0147385 A1* | 6/2010 | Kawano et al. | 136/263 |

FOREIGN PATENT DOCUMENTS

| | | |
|---|---|---|
| EP | 1339112 A2 | 8/2003 |
| EP | 1351558 A1 | 10/2003 |
| JP | 59-194393 A | 11/1984 |
| JP | 3-244630 A | 10/1991 |
| JP | 2003-264085 A | 9/2003 |
| JP | 2003-272860 A | 9/2003 |
| JP | 2004-39617 A | 2/2004 |
| JP | 2004-134395 A | 4/2004 |
| JP | 2005-032492 A | 2/2005 |
| JP | 2005-123094 A | 5/2005 |
| JP | 2005-251529 A | 9/2005 |
| JP | 2005-339823 A | 12/2005 |
| TW | 200539733 A | 12/2005 |
| WO | 90/13148 A1 | 11/1990 |
| WO | 99/03158 A1 | 1/1999 |
| WO | WO 2005076753 A2 * | 8/2005 |
| WO | WO 2006061954 A1 * | 6/2006 |

OTHER PUBLICATIONS

C.W. Tang et al., "Electroluminescence of doped organic thin films", Journal Applied Physics, vol. 65, (May 1, 1989), pp. 3610-3616.

D. Braun et al., "Visible light emission from semiconducting polymer diodes", Applied Physics Letter, vol. 58, (May 6, 1991), pp. 1982-1984.

Chinese Office Action issued in CN 200780004558.5 dated Jun. 29, 2012.

Notice of Reasons for Rejection, drafted Sep. 11, 2012 in the Japanese Patent Office, in corresponding Japanese Patent Application No. 2007-026800, and an English translation thereof.

* cited by examiner

ORGANIC ELECTROLUMINESCENT ELEMENT

TECHNICAL FIELD

The present invention relates to an organic electroluminescent device having high current efficiency and a method of manufacturing the same.

BACKGROUND ART

Recently, Tangs et al. have manufactured an organic electroluminescent device (hereinafter sometimes referred to as an "organic EL device") having a two-layer structure, which consists of a luminescent layer formed of an organic fluorescent dye and a layer formed of an organic charge-transport compound, for example, used in an electrophotographic photoreceptor (Patent Document 1, JP-A-59-194393). There is another report that when a small amount of fluorescent dye is doped to an electron-transport luminescent layer, the fluorescent dye emits light, with the result that a long-life device with high-efficiency can be obtained. An organic EL device is driven by low voltage application and has high brightness compared to competitive devices. In addition to these characteristics, multiple-color emission can be easily obtained. Therefore, many studies have been conducted on the structure of the device, organic fluorescent dyes and organic charge-transport compounds to be used in the device and reported in Non-Patent Document 1: Jpn. J. Appl. Phys. Vol. 27, Page L269 (1988); and Non-Patent Document 2: J. Appl. Phys. Vol. 65, Page 3610 (1989).

Furthermore, separately from organic EL devices primarily using a low molecular-weight organic compound, polymer luminescent devices using a polymer luminescent material (hereinafter referred to as a "polymer fluorescent") have been proposed, for example, in Patent Document 2 (WO9013148 pamphlet); Patent Document 3 (JP-A-3-244630) and Non-Patent Document 3 (Appl. Phys. Lett. Vol. 58, Page 1982 (1991)). The pamphlet of WO9013148 discloses, in an Example, a device using a thin film of poly(p-phenylenevinylene) (hereinafter sometimes referred to as "PPV"), which is a conjugated polymer formed by applying a soluble precursor onto an electrode to form a film, and subjecting the film to heat treatment (thereby converting to the conjugated polymer).

Such a conventional organic EL device has been improved in material and device constitution. As a result, the brightness and life thereof have been enhanced but do not reach practical levels required for use in display and illumination.

Such a conventional organic EL device has a single luminescent unit containing a luminescent layer between electrodes facing each other. To improve the performance thereof, an organic EL device (sometimes called a stacked device), which has a plurality of luminescent units containing a luminescent layer and individually partitioned by a charge generating layer between the electrodes facing each other, has been proposed (Patent Document 4: JP-A-2003-272860)

Patent Document 1: JP-A-59-194393

Patent Document 2: WO9013148 pamphlet

Patent Document 3: JP-A-3-244630

Patent Document 4: JP-A-2003-272860

Non Patent Document 1: Jpn. J. Appl. Phys. Vol. 27, Page L269 (1988)

Non-Patent Document 2: J. Appl. Phys. Vol. 65, Page 3610 (1989)

Non-Patent Document 3: Appl. Phys. Lett. Vol. 58, Page 1982 (1991)

DISCLOSURE OF THE INVENTION

Problem to be Solved by the Invention

However, the aforementioned stacked devices exclusively formed of low molecular-weight materials. If a polymer material is used, a coating method and a printing method suitable for a large scale production can be employed. Therefore, a method of realizing a stacked device using a polymer material has been desired.

Means for Solving the Problem

The present inventors intensively studied with a view to solving the aforementioned problems and manufacturing a stacked organic EL device even though a polymer material(s) is used. As a result, they found that owing to the presence of a charge generating layer manufactured by stacking or mixing materials different in work function, the stacked organic EL device, even if it is formed of films of polymer materials by coating their solutions, it can effectively work and effectively inject electrons and holes into an organic material. Based on the finding, the present invention was achieved.

The present invention is as follows.

(1) An organic electroluminescent device comprising
two electrodes facing each other and connecting to an external circuit providing electric energy, at least one of which is transparent or semitransparent;
a plurality of luminescent units containing one or more organic layers, one of which is a luminescent layer emitting light by recombination of holes and electrons; and
a charge generating layer, which is interposed between two of the luminescent units,
the luminescent units and the charge generating layer being sandwiched by the two electrodes,
characterized in that adjacent two of the luminescent units are partitioned by the charge generating layer;
the charge generating layer comprises one or more types of metals or compounds thereof (A) having a work function of 3.0 eV or less and one or more types of compound (B) having a work function of 4.0 eV or more; and
at least one of the luminescent units has a luminescent layer containing a polymer luminescent material.

(2) The organic electroluminescent device according to item (1), in which the charge generating layer comprises a first layer, which contains the one or more types of metals or compounds thereof (A) and a second layer, which contains the one or more types of compound (B); and the first layer is present at a side facing an electrode injecting holes.

(3) The organic electroluminescent device according to item (1), in which the charge generating layer is a single layer formed of a mixture of the one or more types of metals or compounds thereof (A) and the one or more types of compound (B).

(4) The organic electroluminescent device according to any one of items (1) to (3), in which the charge generating layer has a transmissivity of 30% or more at a wavelength of 550 nm.

(5) The organic electroluminescent device according to any one of items (1) to (4), in which the metal having a work function of 3.0 eV or less is selected from the group consisting of an alkaline metal and an alkaline earth metal.

(6) The organic electroluminescent device according to any one of items (1) to (5), in which the compound having a work function of 4.0 eV or more is an oxide of a transition metal.

(7) The organic electroluminescent device according to item (6), in which the oxide of a transition metal is an oxide(s) of at least one metal selected from the group consisting of V, Nb, Ta, Cr, Mo, W, Mn, Tc and Re.

(8) The organic electroluminescent device according to any one of items (1) to (4), in which the metal having a work function of 3.0 eV or less is Li and the compound having a work function of 4.0 eV or more is $V_2O_5$.

(9) The organic electroluminescent device according to any one of items (1) to (5), in which the compound having a work function of 4.0 eV or more is at least one organic compound.

(10) The organic electroluminescent device according to any one of items (1) to (9), in which the polymer luminescent material has a weight-average molecular weight of 10,000 to 10,000,000 and is soluble in an organic solvent.

(11) The organic electroluminescent device according to any one of items (1) to (10), in which there is a difference in luminescent colors from the luminescent layers of the two luminescent units partitioned by a single charge generating layer.

(12) The organic electroluminescent device according to any one of items (1) to (11), in which the thickness of a layer containing a single luminescent unit and a single charge generating layer between the two electrodes facing each other falls within ±20% of an integral multiple of ¼ of a value which is obtained by dividing a wavelength of light generated from the luminescent unit by an average refractive index of the luminescent unit and the charge generating layer.

(13) A method of manufacturing the organic electroluminescent device according to any one of items (1) to (12), characterized in that at least one of the layers constituting the luminescent unit is a film formed from a solution.

(14) A luminescent apparatus having the organic electroluminescent device according to any one of items (1) to (12).

According to the present invention, a luminescent layer containing a polymer luminescent material can be formed by a coating method. Therefore, the time for manufacturing a stacked EL device can be greatly reduced compared to that for manufacturing a low molecular-weight stacked device having all layers formed by a deposition method.

Advantages of the Invention

According to the organic electroluminescent device of the present invention, a tandem organic EL device can be formed of a polymer material by use of the charge generating layer specific to the present invention.

BEST MODE FOR CARRYING OUT THE INVENTION

A charge generating layer according to the present invention is a layer playing a role in injecting holes in the direction of a cathode and injecting electrons in the direction of an anode, at voltage application time.

In the organic electroluminescent device of the present invention, the charge generating layer is sandwiched between two luminescent units. The "luminescent unit" used herein (in the present invention) refers to a stacked structure containing one or more organic layers including a single luminescent layer, which emits light by recombination of holes and electrons. In the organic EL device of the present invention, a plurality of luminescent units are stacked on top of each other with the charge generating layer interposed between adjacent ones. Furthermore, in at least one of these luminescent units, a single layer of the one or more organic layers constituting the luminescent unit is formed of a luminescent layer containing a polymer luminescent material.

The "luminescent unit" in the present invention corresponds to a portion formed of constitutional devices of a conventional organic EL device only having a single luminescent layer except the electrodes (anode and cathode) facing each other. Therefore, the organic EL device of the present invention may be said to be a structure where a construct formed of a plurality of luminescent units (which include an organic layer having a polymer luminescent material and are partitioned by a charge generating layer specific to the present invention) sandwiched between two electrodes facing each other. In the two electrodes facing each other, at least one of them is transparent or semitransparent and thus light generated in the luminescent layer can be effectively taken out.

A charge generating layer according to the present invention is characterized by containing one or more types of metals or compounds thereof (A) having a work function of 3.0 eV or less and one or more types of compounds (B) having a work function of 4.0 eV or more. The compound of a metal having a work function of 3.0 eV or less refers to a compound having a work function of 3.0 eV or less and whose own work function is 3.0 eV or less. When the work function falls outside the aforementioned range, effective charge injection is unlikely to occur. As a result, the effect of the present invention cannot be sufficiently obtained. Thus, such a case is not preferable.

The metal constituting a charge generating layer and having a work function of 3.0 eV or less may be selected from the group consisting of alkaline metals, alkaline earth metals and rare earth metals. Of them, alkaline metals and alkaline earth metals are preferable. Examples of the alkaline metals preferably include lithium (Li)(2.93 eV), sodium (Na)(2.36 eV), potassium (K)(2.28 eV), rubidium (Rb)(2.16 eV) and cesium (Ce)(1.95 eV). Examples of the alkaline earth metals preferably include calcium (Ca)(2.9 eV) and barium (Ba)(2.52 eV). The numerical value within parentheses denotes a work function. Li is more preferable.

The compound of a metal constituting a charge generating layer and having a work function of 3.0 eV or less refers to, for example, an oxide, halide, fluoride, boride, nitride, or carbide of the aforementioned metals.

The thickness of the first layer is preferably 10 nm or less, and more preferably, 6 nm or less in order to sufficiently obtain the effect of the present invention.

A charge generating layer according to the present invention exerts a particularly prominent effect when one or more types of metals or compounds thereof (A) having a work function of 3.0 eV or less as mentioned above are used in combination with one of more types of compound (B) as mentioned above rather than used singly.

As the charge generating layer in which the metal or a compound thereof (A) is used in combination with the compound (B), the following two cases may be mentioned.

(i) a charge generating layer is a stacked structure formed of a first layer, which contains the one or more types of metals or compounds thereof (A) and a second layer, which contains the one or more types of compounds (B) (stacked structure).

(ii) a charge generating layer is a single layer formed of a component mixture of the one or more types of metals or compounds thereof (A) and the one or more types of compounds (B) as mentioned above (layer of a component mixture).

In the case of the stacked structure, the layers are preferably stacked such that the first layer is arranged on the side of an anode (opposite to an electrode injecting holes) and the second layer is arranged on the side of a cathode. In the case of the layer of a component mixture, the layer can be formed, for example, by a method such as co-deposition in which a layer is formed of two-type material mixture in a single step. Alternatively, a first layer is formed extremely thin, thereby forming a structure having island-like portions discretely distributed, which is a pre-structure for forming a continuous film, and then, a second film is formed on such a structure to obtain the layer of a component mixture.

As a material for constituting the second layer, an inorganic or organic compound having a work function of 4.0 eV or more may be selected. As the inorganic compound having a work function of 4.0 eV or more, an oxide of a transition metal is desirably used. Of the oxides of transition metals, oxides of transition metals such as vanadium (V), niobium (Nb), tantalum (Ta), chrome (Cr), molybdenum (Mo), tungsten (W), manganese (Mn), technetium (Tc) and rhenium(Re) are preferable. $V_2O_5$ and $MoO_3$ are more preferable.

As the organic compound having a work function of 4.0 eV or more for use in the second layer, an electron-accepting material less dissolved in a coating solution to be used in a later step and easily accepts electrons from the first-layer material is preferable. Further preferably, the electron-accepting material preferably forms a charge transfer complex with the first-layer material. As an example of such a material, tetrafluoro-tetracyanoquinodimethane (4F-TCNQ) may be mentioned.

The thickness of the second layer is desirably 2 nm to 100 nm (both inclusive), and further desirably, 4 nm to 80 nm (both inclusive).

Furthermore, the charge generating layer of the present invention may contain a transparent conductive thin film as a third layer. Examples of the transparent conductive thin film that may be used include indium oxide, zinc oxide, tin oxide and a complex thereof, i.e., indium/tin/oxide (ITO).

As a method of forming the charge generating layer of the present invention, for example, a vacuum deposition method, a sputtering method and a coating method may be used.

The charge generating layer of the present invention desirably has high transmissivity to light emitted from a luminescent layer. The transmissivity is desirably 30% or more at a wavelength of 550 nm, and further preferably, 50% or more to sufficiently take out light and obtain sufficient brightness.

(Mixture of Colors, White Color)

The organic EL device of the present invention is a stacked device and contains a plurality of luminescent units simultaneously emitting light. If individual luminescent units are set so as to emit different-wavelength light from each other and the luminescent colors are combined, a different color may be obtained. In particular, white color is created by blending two complementary colors or three colors such as RGB or not less than four colors.

(Cavity Effect)

In the organic EL device of the present invention, it is preferred that the thickness of a layer containing a luminescent unit and a charge generating layer and sandwiched between two electrodes facing each other is an integral multiple of ¼ of the value obtained by dividing the wavelength of light generated from the luminescent unit by an average refractive index of the luminescent unit and the charge generating layer. This is because, in a structure satisfying the aforementioned relationship, a maximum light take-out effect can be obtained owing to a light interference effect. The maximum effect can be obtained when such a relationship is strictly established; however, an effect is produced more or less as long as the film thickness generally falls within ±20% of an integral multiple of ¼ of the value obtained by dividing the wavelength of emission light by the average refractive index. Furthermore, it is preferred that the region where light is substantially emitted is located at a position where the distance from a light-reflecting electrode corresponds to an integral multiple of ¼ of the wavelength of the luminescent light. This is because the light interference effect reaches a maximum.

When the organic EL device is formed of a plurality of luminescent units different in luminescent color, it is preferred that the film thickness is controlled such that any one of the wavelengths of the luminescent color satisfies the aforementioned relationship. Alternatively, the film thickness may be controlled such that two wavelengths satisfy the aforementioned relationship with respect to film thickness.

As the structure of a luminescent unit according to the present invention, a structure conventionally known in the art may be employed. For example, mention may be made of (anode)/luminescent layer/(cathode), (anode)/hole transport layer/luminescent layer/(cathode), and (anode)/hole transport layer/luminescent layer/electron transport layer/(cathode).

In addition to these, a charge injection layer may be provided between an electrode and an organic layer to facilitate injection of charges. As the charge injection layer, an electron injection layer placed on the side of a cathode and a hole injection layer placed on the side of an anode may be mentioned. Furthermore, in order to improve luminescent efficiency, an interlayer may be inserted between the hole transport layer and the luminescent layer or between the electron injection layer and the luminescent layer.

As the transparent electrode or semitransparent electrode serving as a first electrode according to the present invention, a thin film formed of a metal oxide, metal sulfide and metal having a high conductivity may be used. A thin film having high transmissivity is suitably used and appropriately selected depending upon the organic layer to be used. Specific examples thereof include films (NESA, etc.) formed of conductive glass of indium oxide, zinc oxide, tin oxide and complexes thereof such as indium/tin/oxide (ITO) and indium/zinc/oxide; and gold, platinum, silver and copper. ITO, indium/zinc/oxide and tin oxide are preferable. Examples of a film-forming method include a vacuum deposition method, a sputtering method, an ion plating method and a plating method. Furthermore, as the anode, a transparent conductive film formed of an organic material such as polyaniline or a derivative thereof, or polythiophene or a derivative thereof may be used.

The film thickness of the anode may be appropriately selected in consideration of light transmissivity and electroconductivity. For example, the thickness is 10 nm to 10 μm, preferably 20 nm to 1 μm, and further preferably, 50 nm to 500 nm.

Furthermore, a hole injection layer may be formed between the anode and the luminescent unit in order to facilitate hole injection. As a material for the hole injection layer, a material having an intermediate ionization potential between an anode material and a hole transport material is preferably used. For example, use is desirably made of a layer having a thickness of 1 to 200 nm and formed of a conductive polymer such as a phthalocyanine derivative or a polythiolene derivative, an Mo oxide, amorphous carbon, a carbon fluoride or a polyamine compound, or a layer having a thickness of 2 nm or less and formed of a metal oxide, a metal fluoride, an organic insulating material or the like.

Examples of the conductive polymer material may include polyaniline and derivatives thereof, polythiophene and derivatives thereof, polypyrrole and derivatives thereof, polyphenylenevinylene and derivatives thereof, polythienylenevinylene and derivatives thereof, polyquinoline and derivatives thereof, polyquinoxaline and derivatives thereof, and polymers having an aromatic amine structure in the main chain or a side chain.

The electroconductivity of the conductive polymer is preferably from $10^{-7}$ S/cm to $10^3$ S/cm (both inclusive), more preferably, $10^{-5}$ S/cm to $10^2$ S/cm (both inclusive), and further preferably, $10^{-5}$ S/cm to $10^1$ S/cm (both inclusive) to reduce current leakage between luminescent pixels. Generally, the electroconductivity of the conductive polymer is set at a value between $10^{-5}$ S/cm to $10^3$ S/cm (both inclusive) and an appropriate amount of anions are doped in the conductive polymer in order to increase hole-injection ability. Examples of the anions that can be suitably used include polystyrene sulfonate ions, alkylbenzene sulfonate ions and camphor sulfonate ions.

As a second electrode of the present invention, a material having a small work function is preferable. For example, use may be made of an alkali metal such as lithium, sodium, potassium, rubidium or cesium; an alkaline earth metal such as beryllium, magnesium, calcium, strontium or barium; a metal such as aluminum, scandium, vanadium or zinc; a rare earth metal such as yttrium, indium, cerium, samarium, europium, terbium or ytterbium; an alloy of two or more types of these or an alloy of one or more types of these and one or more devices selected from gold, silver, platinum, copper, manganese, titanium, cobalt, nickel, tungsten and tin; graphite; or a graphite intercalation compound. Examples of the alloy include a magnesium-silver alloy, a magnesium-indium alloy, a magnesium-aluminum alloy, an indium-silver alloy, a lithium-aluminum alloy, a lithium-magnesium alloy, a lithium-indium alloy and a calcium-aluminum alloy. The cathode may be a stacked structure formed of two or more layers.

The film thickness of the cathode may be appropriately selected in consideration of electroconductivity and durability. The thickness is, for example, 10 nm to 10 μm, preferably 20 nm to 1 μm, and further preferably, 50 nm to 500 nm.

To facilitate injection of electrons between a cathode and a luminescent unit, an electron injection layer may be formed. As a material for the electron injection layer, a material having electron affinity between a cathode material and an electron transport material is desirable. For example, a metal fluoride, a metal oxide or an organic insulating material may be mentioned. Of them, a fluoride and an oxide of a metal such as an alkaline metal or an alkaline earth metal are preferable. In addition, a conductive polymer material may be used.

As the conductive polymer material, a polymer material having an electroconductivity as described in the paragraph for a hole injection material may be used. To improve electron injection ability, an appropriate amount of cations may be doped. Examples of the cations that may be used include lithium ions, sodium ions, potassium ions and tetrabutylammonium ions.

The film thickness of electron injection layer is, for example, 1 nm to 150 nm, and preferably, 2 nm to 100 nm.

As a method of forming the first electrode (anode) or the second electrode (cathode), a vacuum deposition method, a sputtering method, a laminate method, in which a metal thin film is bonded by thermo-compression, or the like may be used.

The order of forming the first electrode and the second electrode on a base material may not be particularly limited and appropriately selected depending upon an device structure such as a top emission type or a bottom emission type.

Furthermore, in the organic EL device of the present invention, a plurality of luminescent units are used, each having one or more organic layers. One of the organic layers is a luminescent layer. Light is emitted from the luminescent layer by recombination of holes and electrons. In the organic layer, a charge transport material and luminescent material for use in a low molecular-weight organic EL device or a polymer luminescent material for use in polymer organic EL device may be used. Examples of the luminescent colors may include the three primary luminescent colors: red, blue and green, and additionally intermediate luminescent colors thereof and white light. A full-color device preferably emits light of the three primary colors. A planer light source preferably emits white light and light of an intermediate-luminescent color.

As a charge transport material and a luminescent material for use in a lower molecular-weight organic EL device, a known lower molecular-weight compound or triplet emission complex may be mentioned. As the lower molecular-weight compound, for example, use may be made of a naphthalene derivative, anthracene or a derivative thereof, perylene or a derivative thereof, a dye such as a polymethine dye, a xanthene dye, a coumarin dye or a cyanine dye, 8-hydroxyquinoline or a metal complex of a derivative thereof, an aromatic amine, tetraphenylcyclopentadiene or a derivative thereof, or tetraphenylbutadiene or a derivative thereof.

Examples of the triplet emission complex may include Ir(ppy)$_3$ and Btp$_2$Ir(acac) having iridium as a central metal, PtOEP having platinum as a central metal and Eu(TTA)$_3$phen having europium as a central metal.

The thickness of each of the layers may be appropriately selected so as to obtain a desired luminescent efficiency and driving voltage. The thickness is generally from 5 nm to 200 nm. The thickness of a hole transport layer is, for example, 10 to 100 nm, and preferably 20 to 80 nm. The thickness of a luminescent layer is, for example, 10 to 100 nm, and preferably, 20 to 80 nm. The thickness of a hole blocking layer is, for example, 5 to 50 nm, and preferably, 10 to 30 nm. The thickness of an electron injection layer is, for example, 10 to 100 nm, and preferably, 20 to 80 nm.

As a film-forming method for these layers, a vacuum process such as vacuum deposition, cluster deposition or molecular beam deposition may be mentioned. Other than these film forming methods, film forming methods such as a coating method and a printing method (described later) may be mentioned when a soluble material or a material capable of forming an emulsion is used.

Examples of a polymer luminescent material for use in a polymer organic EL device include polyfluorene, derivatives and copolymers thereof; polyarylene, derivatives and copolymers thereof; polyarylenevinylene, derivatives and copolymers thereof; and an aromatic amine and (co)polymers of derivatives thereof. As the luminescent material and charge transport material, the aforementioned luminescent materials and charge transport materials for use in a low molecular-weight EL device may be blended.

In the organic EL device of the present invention, at least one of the luminescent units has a luminescent layer containing a polymer luminescent material.

The weight-average molecular weight of the polymer luminescent material is preferably 10,000 to 10,000,000 and further preferably, 20,000 to 5,000,000. Furthermore, the polymer luminescent material is preferably soluble in an organic solvent.

The thickness of the polymer luminescent layer is, for example, 5 nm to 300 nm, preferably 30 to 200 nm and further preferably, 40 to 150 nm.

As a film-forming method for a luminescent layer, charge transport layer, charge injection layer containing a polymer material; and a luminescent layer, charge transport layer, charge injection layer containing no polymer material as mentioned above, a solution coating method and a printing method may be mentioned. In the solution coating method, a solvent can be easily removed from the applied solution by drying. Furthermore, a charge transport material and a luminescent material are added thereto, the same methods may be used. Thus, these methods are very useful from manufacturing point of view. Examples of the solution coating method for forming a film include coating methods such as a spin-coating method, a casting method, a microgravure-coating method, a gravure-coating method, a bar-coating method, a roll-coating method, a wire-bar coating method, a dip coating method, a spray-coating method, a screen printing method, a flexographic-printing method, an offset printing method and an inkjet printing method. Furthermore, when a charge injection material is used, the charge injection material is dispersed in water or an alcohol to obtain an emulsion, which can be applied in the same manner as in a solution coating method to form a film.

In the coating method and printing method, the solvent to be used for a polymer material is not particularly limited; however a solvent capable of dissolving or uniformly dispersing materials except for the solvent constituting the coating solution is preferable. When the materials constituting the coating solution are soluble in a non-polar solvent, examples of the non-polar solvent that can be suitably used include chloride solvents such as chloroform, methylene chloride and the dichloroethane; ether solvents such as tetrahydrofuran; aromatic hydrocarbon solvents such as toluene, xylene, tetralin, anisole, n-hexylbenzene and cyclohexylbenzene; aliphatic hydrocarbon solvents such as decalin, bicyclohexyl; ketone solvents such as acetone, methyl ethyl ketone and 2-heptanone; and ester solvents such as ethyl acetate, butyl acetate, ethyl cellosolve acetate and propylene glycol monomethyl ether acetate.

As the substrate on which the organic EL device of the present invention is to be formed, any substrate may be used as long as it remains unchanged when the electrodes and the layers constituting the device are formed. Examples thereof may include glass, plastic, polymer film and silicon substrates. When the substrate is not transparent, the electrode facing the substrate is preferably transparent or semitransparent.

EXAMPLES

The present invention will be more specifically described by way of Examples and Comparative Examples; however, the present invention is not limited to these.

Example 1

ITO/PEDOT/MEH-PPV/Li/V$_2$O$_5$/MEH-PPV/LiAl

Figure 1:
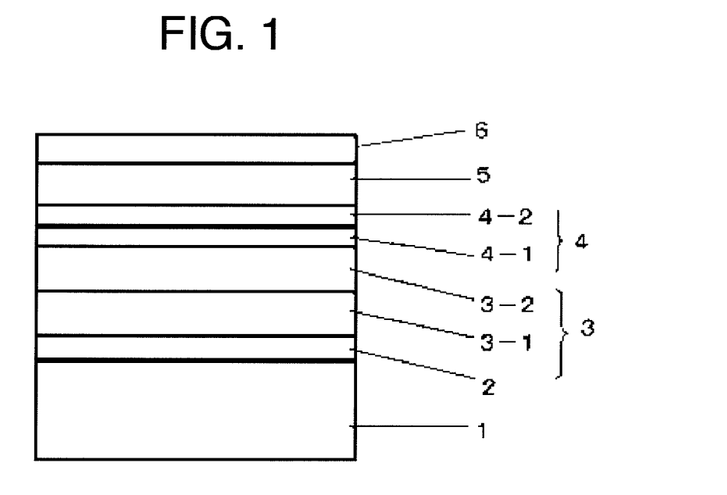
FIG. 1 is an illustration showing a sectional view of the layer structure of an organic EL device according to Example 1 of the present invention.

An example of manufacturing an organic EL device according to the present invention will be described with reference to FIG. 1. Onto a glass substrate 1 on which an ITO film serving as an anode 2 was formed by a sputtering method to a thickness of 150 nm, a PEDOT:PSS solution manufactured by BYTRON was applied by a spin coating method to a thickness of 40 nm to form a film, which was treated with heat at 200° C. under a nitrogen atmosphere to obtain a hole injection layer 3-1. Subsequently, a 1 wt % toluene solution containing MEH-PPV (poly(2-methoxy-5-(2'-ethyl-hexyloxy)-para-phenylenevinylene), which was manufactured by Aldrich and having a weight-average molecular weight of about 200,000 as a luminescent material, was prepared, and applied by a spin-coating method onto the substrate having a PEDOT:PSS film previously formed thereon. In this manner, a first luminescent layer 3-2 having a film thickness of 90 nm was formed. The hole injection layer 3-1 and the first luminescent layer 3-2 constitute a first luminescent unit 3.

On the resultant structure, a charge generating layer 4 was formed by a vacuum deposition method. More specifically, Li (work function: 2.93 eV) and $V_2O_5$ (work function: 4 eV or more) were deposited successively in this order to thickness of 2 nm and 20 nm, respectively. In this manner, a first layer 4-1 and a second layer 4-2 were formed, respectively. Li was deposited by use of an Al—Li alloy (Li content: 0.05%). Since Li is scattered for several tens of seconds before Al started scattering, the Li first scattered was only deposited. Immediately after that, $V_2O_5$ was deposited.

Furthermore, on the $V_2O_5$ film, a 1 wt % toluene solution of MEH-PPV was applied by spin-coating to form a film of a second luminescent layer (second luminescent unit) 5 having a film thickness of 90 nm. Further on this, an Al—Li alloy serving as to a cathode 6 was deposited to a thickness of 100 nm by vacuum deposition. In this manner, an organic EL device having two luminescent units partitioned by a single charge generating layer was manufactured.

When DC voltage was applied to the device thus obtained, a luminescent initiation voltage was 12V and a maximum brightness was 80 cd/m$^2$.

A current efficiency was 0.072 cd/A, which was 1.95 fold as high as that (0.037 cd/A) of the device according to Comparative Example 1 below.

Comparative Example 1

Figure 2:
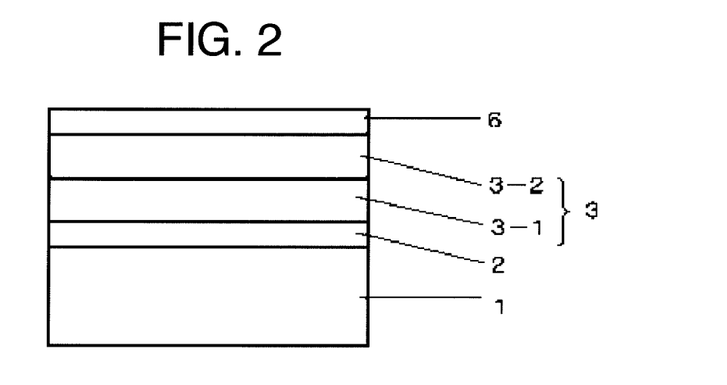
FIG. 2 is an illustration showing a sectional view of the layer structure of a conventional organic EL device.

A device having a single luminescent unit alone as shown in FIG. 2 was also manufactured for comparison sake in the same manner as in Example 1 except that a charge generating layer and the second luminescent layer of Example 1 were not formed. The same explanations as those of FIG. 1 are made on reference numerals of FIG. 2.

When DC voltage was applied to the comparative device, a luminescent initiation voltage was 5.5 V and a maximum brightness was 52 cd/m$^2$. A current efficiency was 0.037 cd/A.

Comparative Example 2

An organic EL device was manufactured in the same manner as in Example 1 except that a charge generating layer was only formed of a single $V_2O_5$ layer having a film thickness of 30 nm. No light was emitted from the obtained device even if a luminescent initiation voltage of 40V was applied.

Example 2

Device Formed of a Stacked Structure of Luminescent Units Different in Luminescent Color and Emitting Mixed Color Light

A first luminescent unit containing a polymer luminescent layer formed of a polymer luminescent material 1 (simply referred to as "8-TPA-BT"), which is represented by structural formula 1 and emits green light, was formed in place of the luminescent layer of Example 1 formed of MEH-PPV, and a charge generating layer 4 was formed. Thereafter, a PEDOT/PSS layer was formed. Subsequently, the film of a second luminescent unit containing a polymer luminescent layer formed of a polymer luminescent material 2 (simply referred to as "F8-TPA-PDA"), which is represented by structural formula 2 and emits blue light, was formed. After that, a cathode was formed in the same manner as in Example 1. In this manner, a luminescent device having two luminescent units emitting light different in wavelength was manufactured.

Polymer material 1

[Formula 1]

Polymer material 2

F8　　　　TPA　　　　PDA

[Formula 2]

Comparative Examples 3 and 4

Comparative Examples to Example 2, a Single-Unit Device Consisting of Green and Blue Light Emitting Luminescent Layers Alone For comparison to Example 2, two devices, each formed of a single luminescent unit 1 having an ITO/PEDOT/luminescent layer/cathode (Li/Al) structure, were formed. One of them contained F8-TPA-BT (Comparative Example 1) emitting green light. The other contains F8-TPA-PDA (Comparative Example 2) emitting blue light.

The driving voltages of Comparative Examples 1 and 2 were 3.6 V and 5.4 V, respectively. In contrast, the driving voltage of Example 2 was 8.0 V, which was close to the expected voltage of an device having two units stacked therein. In addition, in the device of Example 2, luminescent light emitted from two layers were mixed. As a result, whitish green light having a broad spectrum was obtained.

Industrial Applicability

An organic electroluminescent device of the present invention can be used, in combination with a charge generating layer specific to the present invention, for forming a tandem organic EL device composed of a polymer material.

DESCRIPTION OF REFERENCE NUMERALS

1 Substrate
2 Anode (hole injection electrode)
3 First luminescent unit
3-1 Hole injection layer
3-2 First luminescent layer
4 Charge generating layer
4-1 First layer
4-2 Second layer
5 Second luminescent layer (second luminescent unit)
6 Cathode (electron injection electrode)

The invention claimed is:

1. An organic electroluminescent device comprising
two electrodes facing each other and connecting to an external circuit providing electric energy, at least one of which is transparent or semitransparent;
the two electrodes sandwiching a plurality of luminescent units containing one or more organic layers, one of which is a luminescent layer emitting light by recombination of holes and electrons; and
a charge generating layer, which is interposed between two of the luminescent units,
said luminescent units and said charge generating layer being sandwiched by said two electrodes,
characterized in that adjacent two of the luminescent units are partitioned by the charge generating layer;
the charge generating layer comprises one or more types of metals (A) having a work function of 3.0 eV or less and one or more types of compound (B) having a work function of 4.0 eV or more; and
at least one of the luminescent units has a luminescent layer containing a polymer luminescent material selected from the group consisting of polyfluorene, derivatives and copolymers thereof; polyarylene, derivatives and copolymers thereof; polyarylenevinylene, derivatives and copolymers thereof; and (co)polymers of aromatic amines and derivatives thereof, and
at least one of the layers constituting each luminescent unit is a film formed from a solution comprising water.

2. The organic electroluminescent device according to claim 1, wherein the charge generating layer comprises a first layer, which contains the one or more types of metals or compounds thereof (A) and a second layer, which contains the one or more types of compound (B); and the first layer is present at a side facing an electrode injecting holes.

3. The organic electroluminescent device according to claim 1, wherein the charge generating layer is a single layer formed of a mixture of the one or more types of metals or compounds thereof (A) and the one or more types of compound (B).

4. The organic electroluminescent device according to claim 1, wherein the charge generating layer has a transmissivity of 30% or more at a wavelength of 550 nm.

5. The organic electroluminescent device according to claim 1, wherein the metal having a work function of 3.0 eV or less is selected from the group consisting of an alkaline metal and an alkaline earth metal.

6. The organic electroluminescent device according to claim 1, wherein the compound having a work function of 4.0 eV or more is an oxide of a transition metal.

7. The organic electroluminescent device according to claim 6, wherein the oxide of a transition metal is an oxide(s)

of at least one metal selected from the group consisting of V, Nb, Ta, Cr, Mo, W, Mn, Tc and Re.

8. The organic electroluminescent device according to claim 1, wherein the metal having a work function of 3.0 eV or less is Li and the compound having a work function of 4.0 eV or more is $V_2O_5$.

9. The organic electroluminescent device according to claim 1, wherein the compound having a work function of 4.0 eV or more is at least one organic compound.

10. The organic electroluminescent device according to claim 1, wherein the polymer luminescent material has a weight-average molecular weight of 10,000 to 10,000,000 and is soluble in an organic solvent.

11. The organic electroluminescent device according to claim 1, wherein there is a difference in luminescent colors from the luminescent layers of the two luminescent units partitioned by a single charge generating layer.

12. The organic electroluminescent device according to claim 1, wherein a thickness of a layer containing a single luminescent unit and a single charge generating layer between the two electrodes facing each other falls within ±20% of an integral multiple of ¼ of a value which is obtained by dividing a wavelength of light generated from the luminescent unit by an average refractive index of the luminescent unit and the charge generating layer.

13. A luminescent apparatus having the organic electroluminescent device according to claim 1.

14. The organic electroluminescent device according to claim 1, wherein the luminescent layers are formed from the solution comprising water.

15. The organic electroluminescent device according to claim 1, wherein said at least one of the luminescent units has at least one layer other than the luminescent layer, which is selected from the group consisting of a hole transport layer, an electron transport layer, an interlayer inserted between a hole transport layer and a luminescent layer, and an interlayer inserted between a hole injection layer and a luminescent layer, and said at least one layer other than the luminescent layer is formed from a solution comprising water.

* * * * *